United States Patent [19]
Shields et al.

[11] Patent Number: 6,130,169
[45] Date of Patent: Oct. 10, 2000

[54] EFFICIENT IN-SITU RESIST STRIP PROCESS FOR HEAVY POLYMER METAL ETCH

[75] Inventors: Jeffrey A. Shields, Sunnyvale; King Wai Kelwin Ko, San Jose; Leobardo Mercado, Hollister, all of Calif.

[73] Assignee: Advanced Micro Devices, Inc., Sunnyvale, Calif.

[21] Appl. No.: 09/316,491

[22] Filed: May 21, 1999

[51] Int. Cl.$^7$ .................................................. H01L 21/00
[52] U.S. Cl. .......................... 438/725; 134/1.2; 156/345; 216/67; 438/706; 438/710
[58] Field of Search ........................ 134/1.2, 1.3; 216/52, 216/67, 79; 438/696, 706, 707, 710, 725; 156/345 P

[56] References Cited

U.S. PATENT DOCUMENTS

| | | | |
|---|---|---|---|
| 4,736,087 | 4/1988 | Whitlock et al. | 219/121 |
| 5,578,163 | 11/1996 | Yachi | 438/725 X |
| 5,851,302 | 12/1998 | Solis | 134/1.2 |
| 5,925,577 | 7/1999 | Solis | 438/725 |

*Primary Examiner*—William Powell
*Attorney, Agent, or Firm*—LaRiviere, Grubman & Payne, LLP

[57] ABSTRACT

The inventive method allows for a more complete stripping of photoresist and sidewall polymer in the production of semiconductor devices using a four step process in a plasma stripper. The first step uses $CF_4$, $O_2$, and $H_2O$ as etchant gases in a downstream quartz (DSQ) chamber at a low pressure, which are ionized by radio waves for a period of between 5 and 20 seconds. The second step discontinues the radio waves, while continuing the flow of etchant gases and heating the semiconductor. The third step only provides $H_2O$ vapor to the DSQ chamber. The fourth step provides both $O_2$ and $H_2O$ as etchant gases ionized by radio waves to remove the remaining resist.

10 Claims, 4 Drawing Sheets

EFFICIENT IN-SITU RESIST STRIP PROCESS FOR HEAVY POLYMER METAL ETCH

FIELD OF THE INVENTION

The present invention relates to the production of semiconductor devices. More particularly, the present invention relates to in-situ resist removal in the production of semiconductor devices.

BACKGROUND OF THE INVENTION

As semiconductor device geometries continue to scale down, metal etch processes need to generate more sidewall polymer to achieve a desired metal profile and critical dimension (CD) requirements. The removal of this sidewall polymer has become more difficult. Some of the prior art in-situ resist removal procedures prevent corrosion of the metal layers, but are unable to completely remove the sidewall polymer. Some of the prior art in-situ resist removal procedures prevent corrosion of the metal layers, but also result in a very slow removal of the polymer resulting in a low throughput. Other prior art in-situ resist removal procedures are able to quickly remove the sidewall polymer, but cause unacceptable corrosion of the metal layers.

U.S. Pat. No. 4,736,087, issued on Apr. 5, 1988, entitled "Plasma Stripper With Multiple Contact Point Cathode" discloses a plasma photoresist stripper.

U.S. Pat. No. 5,851,302, issued on Dec. 22, 1998, entitled "Method For Etching Sidewall Polymer" discloses a method for using carbon tetrafluoride $CF_4$ and water $H_2O$ as etchant gasses in a LAM 9600 DSQM down stream quartz chamber to remove the entire polymer side wall in a single step. This causes the metal layers to be subject to the $CF_4$ and $H_2O$ etchant gasses during this entire single step causing a greater risk of attack or corrosion of the various metal films.

Other art teaches using oxygen $O_2$, $CF_4$ and $H_2o$ as etchant gasses for a period longer than 60 seconds. Such long exposures increases titanium nitride TiN attack or aluminum corrosion. By the end of this period, the semiconductor is heated by a chuck causing even greater TiN attack or aluminum corrosion.

It would be desirable to have a method of in-situ resist removal that completely removes sidewall polymer with a high throughput and a minimal amount of corrosion.

BRIEF SUMMARY OF THE INVENTION

It is an object of the invention to provide an improved method of in-situ resist removal of sidewall polymer with high throughput and minimal corrosion to metal layers.

Accordingly, the foregoing object is accomplished by an in-situ resist removal using four steps. The first step uses $CF_4$, $O_2$, and $H_2o$ ionized by a radio frequency as etchant gases in a downstream quartz (DSQ) chamber at a low pressure for a period less than 20 seconds. The second step discontinues the radio frequency and continues the flow of etchant gases at a higher pressure and heats the semiconductor. The third step only provides $H_2O$ vapor and a radio frequency to the DSQ chamber. The fourth step provides both Q and $H_2O$ as etchant gases which are ionized by a radio frequency to remove the remaining resist.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
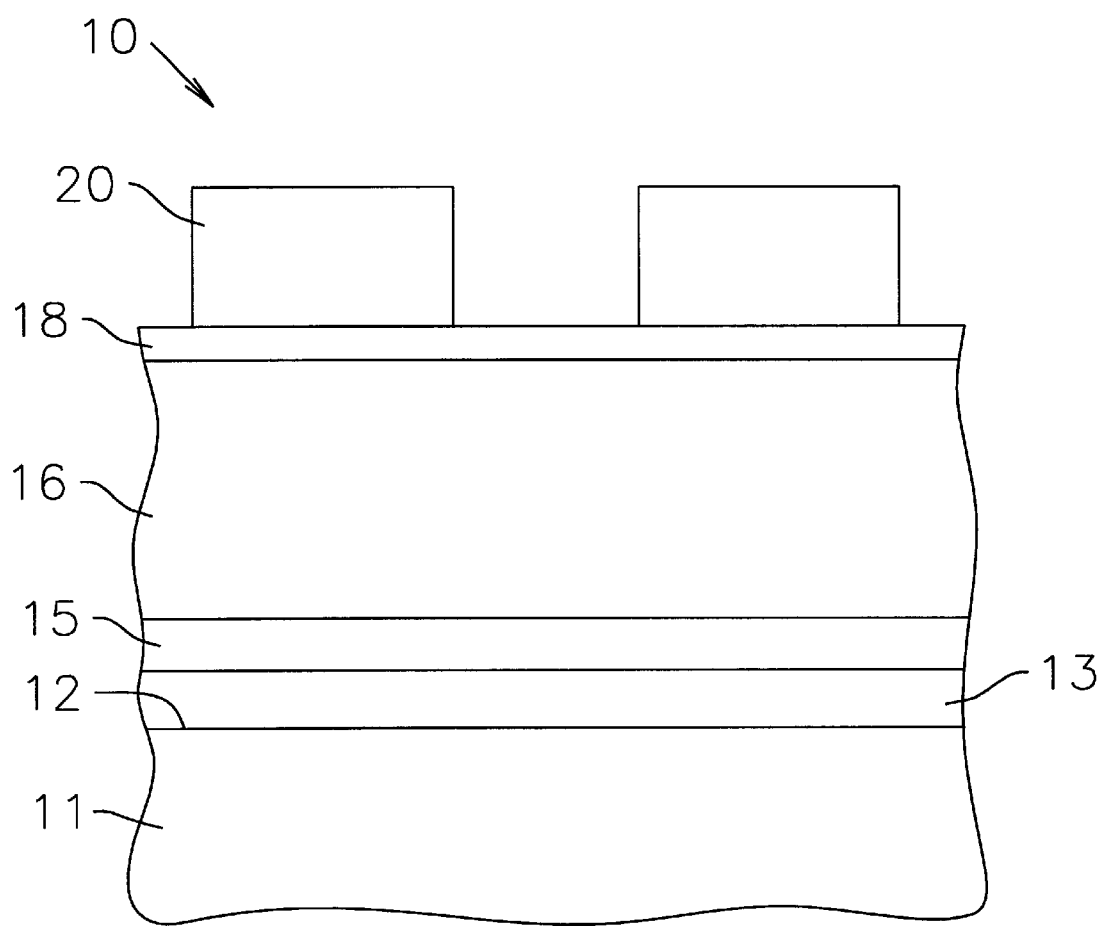
FIG. 1 is a cross sectional view of part of an unfinished semiconductor device prior to undergoing the inventive process.

Reference numbers refer to the same or equivalent parts of the present invention throughout the several figures of the drawing.

DETAILED DESCRIPTION OF THE INVENTION AND BEST MODE OF THE INVENTION

FIG. 1 is a cross sectional view of part of an unfinished semiconductor device 10 on a semiconductor substrate 11, which has an upper surface 12. An oxide layer 13 is deposited on the upper surface 12. A first refractory metal layer 15 is deposited on the oxide layer 13. In this example, the first refractory metal layer 15 is made of a refractory metal chosen from the group consisting of titanium Ti, titanium nitride TiN, titanium/titanium nitride Ti/TiN. An aluminum alloy layer 16 is deposited on the first refractory metal layer 15. A second refractory metal layer 18 is deposited on the aluminum alloy layer 16. In this example, the second refractory metal layer is made of a refractory metal chosen from the group consisting of Ti, TiN, Ti/TiN. A photoresist mask 20 is placed on the second refractory metal layer 18.

The semiconductor device 10 then is subjected to a plasma etching to provide a metal etch. In plasma etching a power source creates a radio frequency field, which is used to energize etchant gases to a plasma state. The etchant gases attack the metal layer etching away the parts of the first refractory metal layer 15, aluminum alloy layer 16, second refractory metal layer 18, and the oxide layer 12 that are not covered by the photoresist mask 20.

Figure 2:
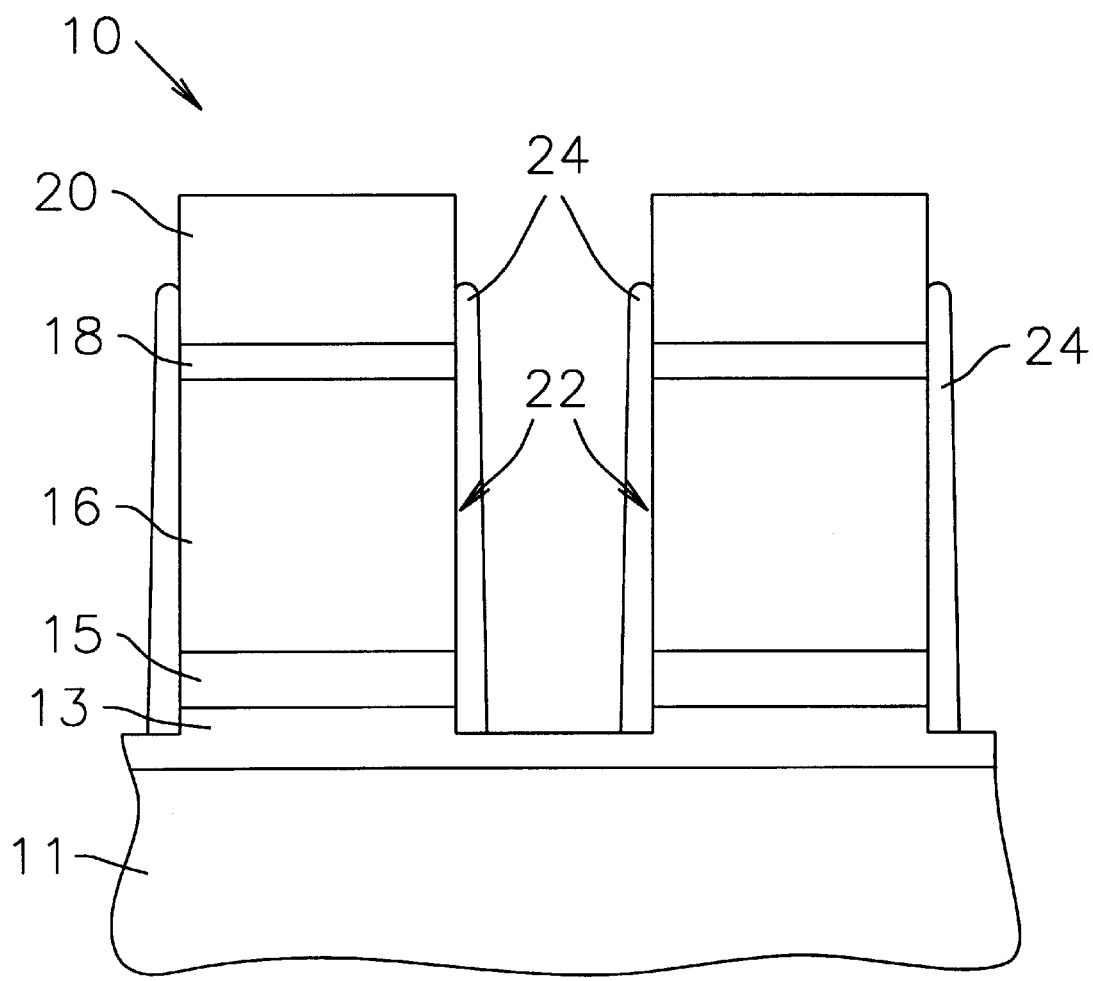
FIG. 2 is a cross sectional view of the part of the unfinished semiconductor device, shown in FIG. 1, after it has gone through the metal etch.

FIG. 2 is a cross sectional view of the part of the unfinished semiconductor device 10 after it has gone through the metal etch. Two stacks 22 are formed with each stack comprising an oxide layer 13, a first refractory metal layer 15, an aluminum alloy layer 16, and a second refractory metal layer 18, capped by the photoresist mask 20. The etchant gasses deposit some of the photoresist onto the side walls of the stacks 22, creating sidewall polymer residue 24.

Figure 3:
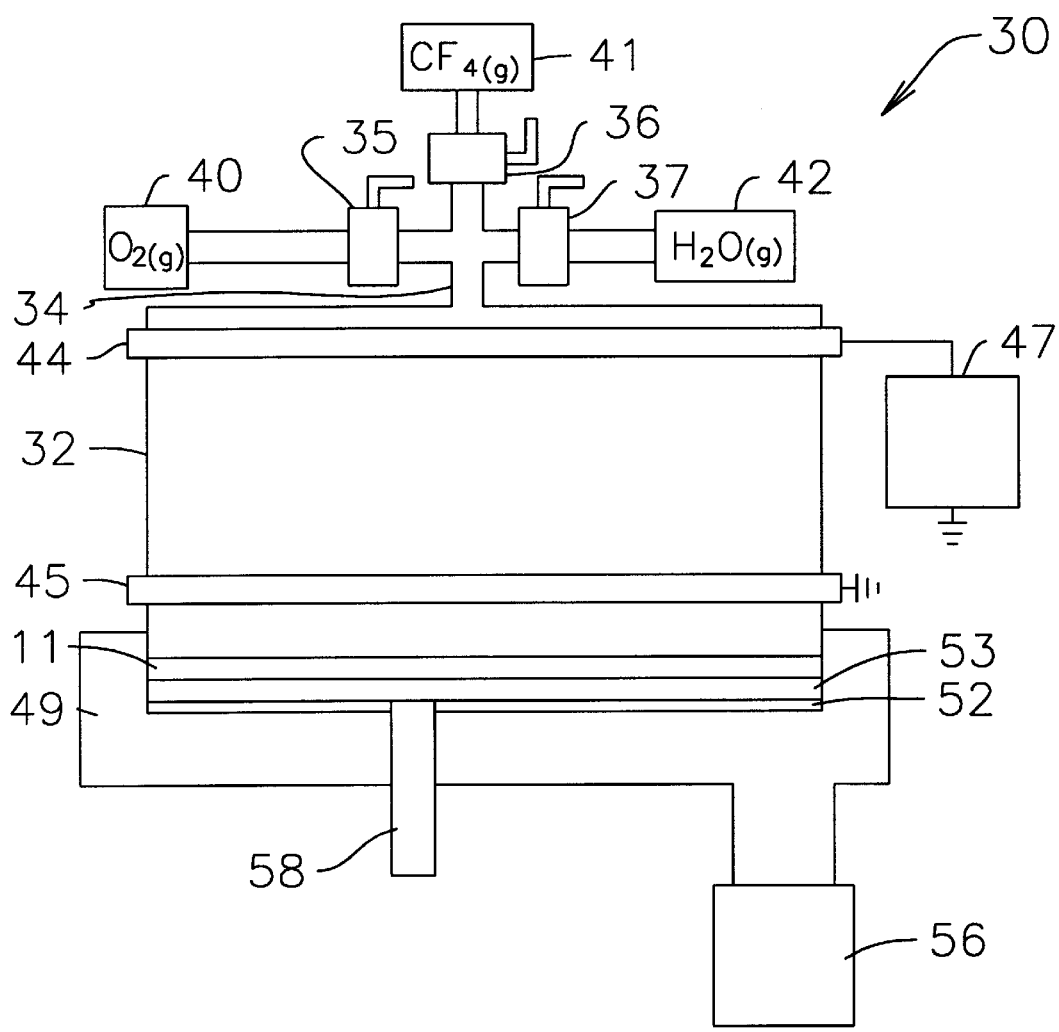
FIG. 3 is a schematic view of a down stream plasma stripper device.

The semiconductor device 10 is then placed in a plasma stripper device. FIG. 3 is a schematic view of a down stream plasma stripper device 30. The plasma stripper device 30 comprises a quartz chamber 32. An infeed line 34 is connected to the top of the quartz chamber 32. The infeed line 34 splits into three branches where the first branch has a first valve 35, the second branch has a second valve 36, and the third branch has a third valve 37. An oxygen gas $(O_{2(g)})$ source 40 is connected to the first branch through the first valve 35. A carbon tetrafluoride gas $(CF_{4(g)})$ source 41 is connected to the second branch through the second valve 36. A water vapor $(H_2O_{(vap)})$ source 42 is connected to the third branch through the third valve 37. A ring shaped cathode 44 surrounds and is located near the top of the quartz chamber 32. A ring shaped anode 45 surrounds and is located near the bottom of the quartz chamber 32. The cathode 44 is electrically connected to a radio frequency power supply 47, while the anode 45 is grounded. The quartz chamber 32 is mounted on a base 49, which seals an open end of the quartz chamber 32. An insulating mount 52 is mounted within the base 49. A chuck 53 is mounted on the insulating mount 52. The semiconductor substrate 11 is mounted on the chuck 53. A vacuum system 56 is connected to the chamber through the base 49. A thermal control 58 is in thermal connection with the chuck 53.

The inventive method places the semiconductor substrate 11 onto the chuck 53 as shown in FIG. 3. The semiconductor substrate 11 is normally at a temperature between 50° C. to 100° C. before the substrate 11 is placed on the chuck. The chamber is evacuated to between 500 to 1,000 mT (milliTorr). The thermal control 58 heats the chuck 53 to a temperature between 180° C. and 240° C. In the first step, the first valve 35, second valve 36, and third valve 37 are opened to provide $O_{2(g)}$, $CF_{4(g)}$, and $H_2O_{(vap)}$ into the chamber. The first, second, and third valves 35, 36, 37 are set so that the first valve 35 provides q at a rate of 600 standard cubic centimeters per minute (sccm), the second valve 36 provides $CF_4$ at a rate of 30 sccm, and the third valve 37 provides $H_2O$ at a rate of 60 sccm. The radio frequency power supply 47 provides from 500 to 1,000 Watts of an inductively coupled radio frequency signal power to the cathode 44 of a period of 5 to 20 seconds. Due to the low pressure, the semiconductor substrate 11 is heated slowly so that at the end of this period, the semiconductor substrate is between about 100° C. to 200° C.

At the end of this period, for step 2 (the heatup step), the radio frequency power supply 47 is turned off, allowing the flow of the etchant gases to continue without radio frequency excitation. The pressure is also increased, allowing the semiconductor substrate to heat up over a period of 5 to 15 seconds to a temperature approximately equal to the temperature of the chuck.

Step 3 is a passivation step. The first valve 35 and second valve 36 are closed, only allowing the third valve 37 to provide a flow of only $H_2O$ at a rate of 60 sccm. The radio frequency power supply 47 provides from 500 to 1,000 Watts of an inductively coupled radio frequency signal power to the cathode 44 of a period of 15 to 60 seconds. It is believed that free hydrogen combines with chlorine on the wafer to form hydrogen chloride HCL, which is removed from the chamber with the water, providing corrosion prevention (passivation).

Step 4 (the bulk strip step) opens the first valve, providing the flow of $O_2$ at 600 sccm and continuing the flow of $H_2O$ at 60 sccm. The radio frequency power supply 47 provides from 500 to 1,000 Watts of a radio frequency signal power to the cathode 44 of a period of 30 to 90 seconds. Most of the stripping occurs during this step so that at the end of this step, the resist is removed.

Figure 4:
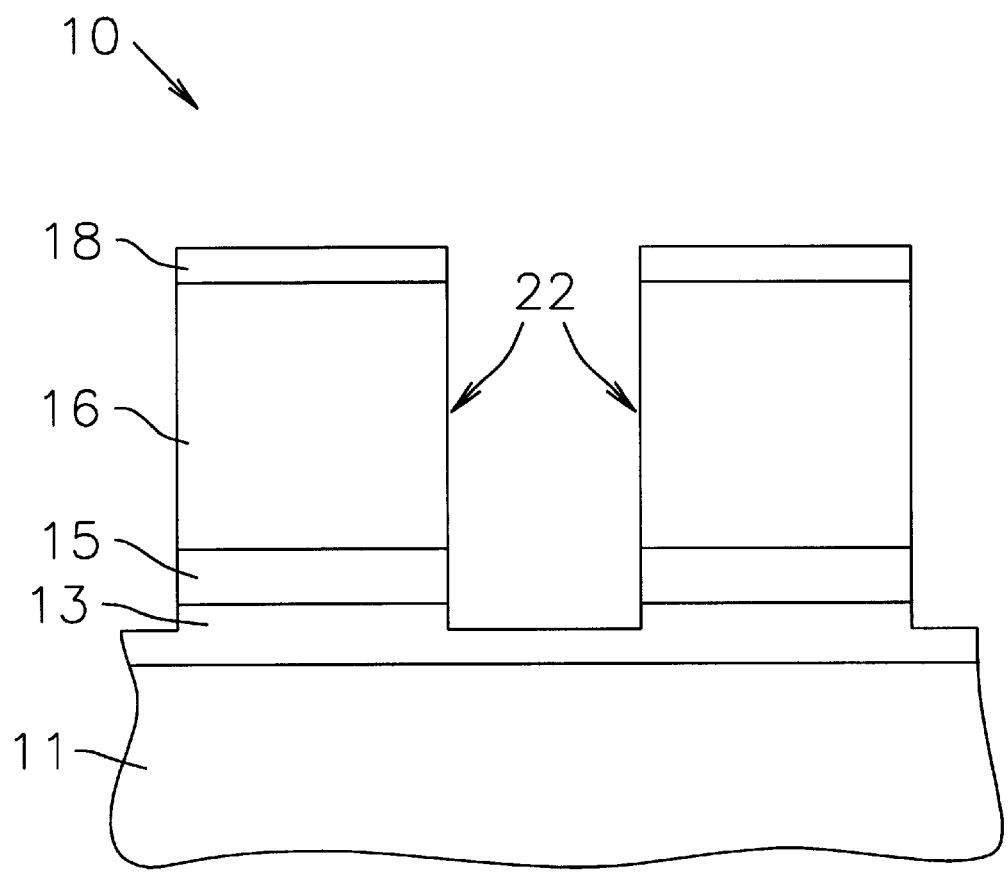
FIG. 4 is a cross sectional view of the part of the unfinished semiconductor device, shown in FIG. 1, after it has been removed from the plasma stripper device and undergone a wet solvent clean.

The semiconductor substrate 11 is then removed from the plasma stripper device 30. The semiconductor substrate 11 is then subjected to a wet solvent clean to remove remaining sidewall polymer residue 24. FIG. 4 is a cross sectional view of the part of the unfinished semiconductor device 10 after it has been subjected to a wet solvent clean. The sidewall polymer residue 24 and the photoresist mask 20 (FIG. 2) have been stripped from the stacks 22.

The unfinished semiconductor device undergoes further processes known in the prior art to complete the semiconductor device.

In the preferred embodiment, the flow rate of the $CF_4$ is 5% of the flow rate of $O_2$, and the flow rate of $H_2O$ is 10% of the flow rate of $O_2$ as shown in the example above. In other embodiments, the flow rate of the $CF_4$ is 4–6% of the flow rate of $O_2$, and the flow rate of $H_2O$ is 8–12% of the flow rate of $O_2$. These flow rates may be varied, as long as too much $CF_4$ is not used or too little $H_2O$ is not used so that there is less TiN attack and aluminum corrosion.

The short time period of step 1 is long enough to provide initial stripping of the polymer layer, but without the complete stripping of the polymer layer. Because the time period of step 1 is between 5 to 20 seconds, and not longer, there is a reduction of TiN attack and aluminum corrosion, higher throughput, and sufficient stripping to allow complete stripping during the following steps. Since step 1 is done at a low pressure, the semiconductor substrate 11 has a temperature that is at least 40° C. less than the temperature of the chuck, further reducing TiN attack and aluminum corrosion.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is specifically disclosed herein.

We claim:

1. A method of in-situ photoresist removal in semiconductor devices, comprising the steps of:

placing a semiconductor substrate in a plasma stripper device; and subjecting the semiconductor substrate to a three gas step for a period of between 5 and 20 seconds, wherein the three gas step comprises the steps of:

providing a flow of $O_2$ into the plasma stripper device;

providing a flow of $CF_4$ into the plasma stripper device;

providing a flow of $H_2O$ into the plasma stripper device to mix with the $O_2$ and $CF_4$; and providing a radio frequency signal into the plasma stripper device.

2. The method, as recited in claim 1, wherein the step of subjecting the semiconductor substrate, further comprises the step of evacuating the pressure in the plasma stripper device to a pressure of 1,000 milliTorr or less.

3. The method, as recited in claim 2, wherein the step of subjecting the semiconductor substrate, provides a flow rate of $CF_4$, which is between 4% to 6% of the flow rate of $O_2$.

4. The method, as recited in claim 3, wherein the step of subjecting the semiconductor substrate, provides a flow rate of $H_2O$, which is between 8% to 12% of the flow rate of $O_2$.

5. The method, as recited in claim 4, wherein the step of providing a radio frequency signal provides a radio frequency signal of a power in the range between 500 to 1,000 Watts.

6. The method, as recited in claim 5, further comprising the steps of:

heating up the semiconductor substrate;

subjecting the semiconductor substrate to passivation; and bulk stripping remaining photoresist.

7. The method, as recited in claim 6, wherein the step of heating up the semiconductor substrate, comprises the steps of:

stopping the radio frequency signal provided to the plasma stripper; and increasing the pressure in the plasma stripper wherein $O_2$, $CF_4$, and $H_2O$ continues to flow into the plasma stripper.

8. The method, as recited in claim 7, wherein the step of subjecting the semiconductor substrate to passivation, comprises the steps of:

stopping the flow of $O_2$ and $CF_4$; and providing a radio frequency signal into the plasma stripper.

9. The method, as recited in claim 8, wherein the step of bulk stripping the remaining photoresist, comprises the steps of:

providing a flow of $O_2$;

continuing the flow of $H_2O$ and the radio frequency signal.

10. The method, as recited in claim 9, further comprising the step of subjecting the semiconductor substrate to a wet solvent clean.

* * * * *

UNITED STATES PATENT AND TRADEMARK OFFICE
CERTIFICATE OF CORRECTION

PATENT NO : 6,130,169
DATED : October 10, 2000
INVENTOR(S): Jeffery Shields, Stephen Wai Kelwin Ko, Leobardo Mercado It is certified that error appears in the above-identified patent and that said Letters Patent is hereby corrected as shown below:

In Column 3, Line 20 after the word provides, please delete [ q ] and replace with $--O_2--$.

Signed and Sealed this

Eighth Day of May, 2001

Attest:

NICHOLAS P. GODICI

*Attesting Officer*  *Acting Director of the United States Patent and Trademark Office*